(12) United States Patent
Liou et al.

(10) Patent No.: US 6,271,137 B1
(45) Date of Patent: *Aug. 7, 2001

(54) METHOD OF PRODUCING AN ALUMINUM STACKED CONTACT/VIA FOR MULTILAYER

(75) Inventors: Fu-Tai Liou; Fusen E. Chen, both of Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/146,823

(22) Filed: Nov. 1, 1993

Related U.S. Application Data

(63) Continuation of application No. 07/621,367, filed on Nov. 30, 1990, now abandoned, and a continuation-in-part of application No. 07/609,883, filed on Nov. 5, 1990, now Pat. No. 5,108,951, which is a continuation-in-part of application No. 07/443,898, filed on Nov. 20, 1989, now abandoned.

(51) Int. Cl.⁷ .................................................. H01L 21/44
(52) U.S. Cl. ......................... 438/688; 438/646; 438/660
(58) Field of Search ............................. 437/187, 188, 437/189, 190, 194, 197, 198, 199; 438/632, 646, 688, 660

(56) References Cited

U.S. PATENT DOCUMENTS

| | | | |
|---|---|---|---|
| 3,158,504 | 11/1964 | Anderson | 437/187 |
| 3,900,598 | 8/1975 | Hall et al. | 437/194 |
| 4,107,726 | 8/1978 | Schilling | 437/187 |
| 4,436,582 * | 3/1984 | Saxena | 437/197 |
| 4,502,209 * | 3/1985 | Eizenberg et al. | 437/190 |
| 4,566,177 | 1/1986 | van de Ven et al. . | |
| 4,592,802 | 6/1986 | Deleonibus et al. | 156/644 |
| 4,661,228 | 4/1987 | Mintz | 204/192.25 |
| 4,756,810 | 7/1988 | Lamont et al. | 204/192.3 |
| 4,759,533 | 7/1988 | Magee et al. | 437/173 |
| 4,772,571 | 9/1988 | Scovell et al. | 437/200 |
| 4,837,183 * | 6/1989 | Polito et al. | 437/198 |
| 4,892,844 | 1/1990 | Cheung et al. | 437/194 |
| 4,944,961 | 7/1990 | Lu et al. | 427/38 |
| 4,970,176 * | 11/1990 | Tracy et al. | 437/187 |
| 4,975,389 | 12/1990 | Ryan et al. | 437/197 |
| 4,976,839 | 12/1990 | Inoue | 204/192.17 |
| 4,988,423 | 1/1991 | Yamamoto et al. . | |
| 4,994,162 | 2/1991 | Armstrong | 204/192.15 |
| 5,106,781 | 4/1992 | DeVries | 437/192 |
| 5,108,570 | 4/1992 | Wang | 204/192.3 |
| 5,108,951 | 4/1992 | Chen et al. | 437/187 |

FOREIGN PATENT DOCUMENTS

| | | |
|---|---|---|
| 0 107 259 A3 | 5/1984 | (EP) . |
| 0 132 720 A1 | 2/1985 | (EP) . |
| 0 137 701 A1 | 4/1985 | (EP) . |

(List continued on next page.)

OTHER PUBLICATIONS

Inoue, M., et al., J. Vac. Sci. Technol., A6(3), May/Jun. 1988, pp. 1636–1639.*
Ono, et al., VMIC Conf. Jun. 12–13, 1990. pp. 76–82 "Development of A Planarized . . .".*
Inoue, M., et al., "The Properties of Aluminum . . .", J. Vac. Sci. Technol. A6(3), May/Jun. 1988, pp. 1636–1639.*

(List continued on next page.)

*Primary Examiner*—T. N. Quach
(74) *Attorney, Agent, or Firm*—Theodore E. Galanthay; Lisa K. Jorgensen; Daniel V. Venglarik

(57) ABSTRACT

A method is provided for forming improved quality inter-level aluminum contacts in semiconductor integrated circuits. A contact opening is formed through an insulating layer. A barrier layer is deposited over the surface of the integrated circuit. An aluminum layer is then deposited at relatively low deposition rates at a temperature which allows improved surface migration of the deposited aluminum atoms. Aluminum deposited under these conditions tends to fill contact vias without the formation of voids. The low temperature deposition step can be initiated by depositing aluminum while a wafer containing the integrated circuit device is being heated from cooler temperatures within the deposition chamber.

10 Claims, 1 Drawing Sheet

FOREIGN PATENT DOCUMENTS

| | | |
|---|---|---|
| 0 168 828 A2 | 1/1986 | (EP) . |
| 0 257 277 A2 | 3/1988 | (EP) . |
| 0 269 019 A3 | 6/1988 | (EP) . |
| 0 273 715 A2 | 7/1988 | (EP) . |
| 0 276 087 A2 | 7/1988 | (EP) . |
| 0 310 108 A2 | 4/1989 | (EP) . |
| 0 329 227 A1 | 8/1989 | (EP) . |
| 0 351 001 A1 | 1/1990 | (EP) . |
| 0 488 628 A2 | 11/1990 | (EP) . |
| 0 430 403 A2 | 6/1991 | (EP) . |
| 0 451 571 A2 | 10/1991 | (EP) . |
| 0 488 264 A3 | 6/1992 | (EP) . |
| 0 499 241 A1 | 8/1992 | (EP) . |
| 2 112 566 | 7/1983 | (GB) . |
| 2 128 636 | 5/1984 | (GB) . |
| 54-71564 | 8/1979 | (JP) . |
| 57-139939 | 8/1982 | (JP) . |
| 58-46641 | 1/1983 | (JP) . |
| 60-227446 | 11/1985 | (JP) . |
| 61-142739 | 6/1986 | (JP) . |
| 63-124447 | 5/1988 | (JP) . |
| 63-136547 | 6/1988 | (JP) . |
| 2-137230 | 11/1988 | (JP) . |
| 1-160036 | 6/1989 | (JP) . |
| 1-077122 | 9/1989 | (JP) . |

OTHER PUBLICATIONS

Ono, H., et al., "Development of A Planarized . . .", Jun. 12–13, 1990, VMIC Conf., pp. 76–82.*

Ting., C.Y., "Tin Formed by Evaporation . . .", J. Vac. Sci. Technol., 21(1), May/Jun. 1982. pp. 14–18.*

Wolf, et al., Silicon Processing, vol. I, Lattice Press, 1986, pp. 332–334, 367–374.*

TiN Metallization Barriers: From 1.2μ to 0.35μ Technology Fabio Pintchovski and Ed Travis, Motorola, Inc., Austin, Texas pp. 777 —786, 1992 Materials Research Society.

"Development of a Planarized Al–Sl Contact Filling Technology" Hisako Ono, et al., VMIC Conference, Jun. 1990, pp. 76–82.

"Aluminum Metallization for ULSI", Dipankar Pramanik et al., Solid State Technology Mar. 1990, No. 3, Westford, MA. pp. 73–79.

"Thin–film reactions of Al with Co, Cr, Mo, Ta, Ti, and W" E. G. Golgan, et al., vol. 4, No. 1989 Materials Research Society, pp. 815–820.

"Planarized Aluminum Deposition on TiW and TiN Layers by High Temperature Evaporation", G. E. Georgiou, et al., AT&T Bell Laboratories, Jun. 1989 VMIC Conference, pp. 315–321.

"The properties of aluminum thin films sputter deposited at elevated temperatures," M. Inoue et al., J. Vac. Sci. Technol. May 6, 1988, pp. 1636–1939.

"Evaluation of Titanium as a Diffusion Barrier Between Aluminum and Silicon for 1.2 μm CMOS Integrated Circuits," M. Farahani, et al., Electrochemical Society Active Member, pp. 2835–2845.

"Nonconformal Al Via Filling and Planarization by Partially Ionized Beam Deposition for Multilevel Interconnection," S. N. Mei, et al., 1987 IEEE, pp. 503–505.

"Aluminum Alloy Planarization for Topography Control of Multi–level VLSI Interconnect," van Gogh, et al., 1987 IEEE, pp. 371–375.

"Interconnect Materials for VLSI Circuits," Y. Pauleau, Centre National d'Etudes des Telecommunications, Meylan, France 1987, pp. 155–1620

"Planarization of Al Alloy Film During High Rate Sputtering," V. Hoffman, et al., Mar. 1986, Report No. 122, pp. 1–20.

"Sputtering and Interconnect Trends," Peter Burggraaf, Semiconductor International, Nov. 1984, pp. 70–73.

"TiN formed by evaporation as a diffusion barrier between Al and Si," C. Y. Ting, IBM T. J. Watson Research Center, Yorktown Heights, New York 10598, May 6, 1982, pp. 14–18.

"High–temperature contact structures for silicon semiconductor devices," M. Wittmer, Brown Boveri Research Center, 5405 Baden–Dattwil, Switzerland, 9/80 pp. 540–542.

* cited by examiner

METHOD OF PRODUCING AN ALUMINUM STACKED CONTACT/VIA FOR MULTILAYER

This application is a continuation of application Ser. No. 07/621,367 filed Nov. 30, 1990, now abandoned, which is a continuation-in-part of application Ser. No. 07/443,898 filed Nov. 20, 1989 and entitled METHOD FOR FABRICATING INTERLEVEL CONTACTS, now abandoned, and a continuation-in-part of application Ser. No. 07/609,883 filed Nov. 5, 1990 and entitled METHOD FOR FORMING A METAL CONTACT, now U.S. Pat. No. 5,108,951.

1. TECHNICAL FIELD

The present invention relates generally to semiconductor integrated circuit processing, and more specifically to producing an aluminum stacked contact/via for multilayer interconnections.

2. DESCRIPTION OF THE PRIOR ART

Metal films are used extensively in the field of semiconductor integrated circuit fabrication for surface wiring. The metallization process of wiring components together begins with etching contact openings or vias through the various layers down to the active regions within a semiconductor substrate, or to contact an underlying polycrystalline silicon or a metal interconnect layer. A conductive metal is then deposited over the surface of the wafer in a manner that provides good contact with the underlying active device. Increasing chip density and smaller geometries have decreased the available area for surface wiring. Multilevel metal arrangements have solved part of this problem.

Because of its physical properties, aluminum is especially well suited for fabrication of metal interconnects. Among the properties which make aluminum so useful is the fact that it is very conductive, it forms a good mechanical bond with various dielectric layers generally used in the semiconductor industry, and it makes a good ohmic contact with both N and P type semiconductors. However, the sputtering process used to apply aluminum thin film layers to an integrated circuit generally results in less than ideal filling of contact vias. Large aluminum grains tend to form on the upper surface of the insulating layer. These grains which form at the edges of the contact via tend to block the contact opening before the aluminum has a chance to completely fill the contact via. This blockage produces a thinner layer of aluminum along the sides of the insulating layer, increasing the current density through that part of the contact opening and resulting in voids and uneven structures within the via. This problem is enhanced as circuit devices are fabricated using smaller geometries.

The uneven thickness of the aluminum layer going into the via, caused by the step coverage problem described above, has an adverse impact on device functionality. If the voids in the via are large enough, contact resistance can be significantly higher than desired. In addition, the thinner regions of the aluminum layer will be subject to the well known electromigration problem. This problem can cause eventual open circuits at the contacts and premature failure of the devices. The devices must be designed so that the current density in the aluminum interconnect lines does not become high enough to cause rapid electromigration. The thinner regions of the aluminum layer tend to occur over abrupt height changes on the surface of the integrated circuit.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because they consume too much area on a chip.

Even with these techniques, the problems of completely filling a via with aluminum are not solved. In part, this is due to the fact that aluminum is deposited at a temperature which tends to encourage fairly large grain sizes. Voids and other irregularities within the contact continue to be problems with current technologies.

One technique which has been proposed to overcome the via filling problem is to deposit the aluminum interconnect layers at a temperature between 500 degrees C. and 550 degrees C. At these temperatures, the liquidity of the aluminum is increased, allowing it to flow down into the vias and fill them. This technique is described, for example, in DEVELOPMENT OF A PLANARIZED Al—Si CONTACT FILLING TECHNOLOGY, H. Ono et al, June 1990 VMIC Conference proceedings, pages 76–82. At temperatures below 500 degrees C. and above 550 degrees C. result in degraded metal filling of contact vias. It is believed that use of such technique still suffers from problems caused by large grain sizes.

It would be desirable to provide a technique for manufacturing integrated circuits whereby contact openings are completely filled improving coverage in contact vias. It is further desirable that such a technique be compatible with current standard process flows.

SUMMARY OF THE INVENTION

It is therefore an object of the present invention to provide a semiconductor fabrication technique for forming an aluminum contact on an integrated circuit.

It is another object of the present invention to provide such a method in which aluminum fills the contact via while eliminating voids being formed therein.

It is a further object of the present invention to provide such a method which is suitable for use at one micron and submicron geometries.

It is yet another object of the present invention to provide such a method which is compatible with current process technology.

Therefore, according to the present invention, a method is provided for depositing improved quality aluminum thin film interlevel contacts in a semiconductor integrated circuit. A contact opening is formed through an insulating layer. A barrier layer is deposited over the surface of the integrated circuit chip. An aluminum layer is deposited at relatively low deposition rates at a temperature which allows improved surface migration of the deposited aluminum atoms. Aluminum deposited under these conditions tends to fill contact vias without the formation of voids. The low temperature deposition step can be initiated by deposition aluminum while a wafer containing the integrated circuit device is being heated from cooler temperatures within the deposition chamber. Formation of the aluminum contact under these conditions helps to fill the contact opening and provide a smooth upper contour to the deposited aluminum layer so that additional aluminum contacts may be formed on top of the first aluminum contact.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
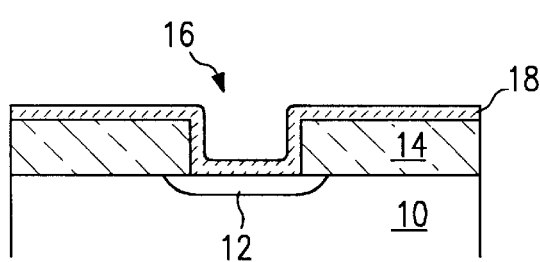
FIGS. 1–3 illustrate a preferred method for fabricating an interlevel aluminum contact according to the present invention.

Referring to FIG. 1, a substrate 10 includes an active region 12 such as a source/drain region of a field effect transistor. An insulating layer 14, such as a reflow glass or other oxide layer as known in the art, is formed over the substrate 10 and planarized. Layer 14 typically has a thickness on the order of approximately 5000 to 10000 angstroms. A contact via 16 is formed in the insulating layer 14 in order to allow an upper level conductor to make contact with the active region 12.

A barrier metal layer 18, such as a refractory metal alloy, is deposited over the surface of the integrated circuit as known in the art. Layer 18 is relatively thin, typically approximately 1000 to 2000 angstroms thick, and is deposited conformally to cover the bottom and sidewalls of contact opening 16. The purpose of the barrier metal layer is to act as a diffusion barrier and to lower the contact resistance. The barrier metal layer may also be a refractory metal silicide, refractory metal nitride or a composite layer such as a refractory metal/refractory metal nitride, refractory metal/refractory metal silicide or refractory metal silicide/refractory metal nitride. A composite layer using a refractory metal underlying a refractory metal nitride or refractory metal silicide provides for good adhesion to the insulating layer 14 and reduces contact/via resistance.

Figure 2:
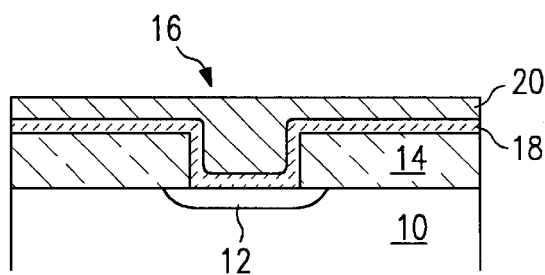
Figure 3:
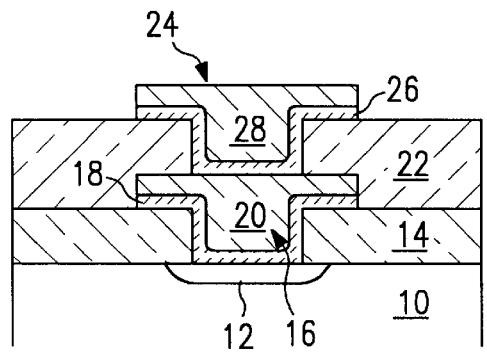

Referring to FIG. 2, an aluminum layer 20 is deposited over the surface of the device. The aluminum layer 20 does not alloy or react with the barrier metal layer 18. However, when the aluminum layer 20 is deposited using the process conditions described below, the layer 20 completely fills in the contact via 16 and tends toward leveling the upper surface of the aluminum layer 20 as shown in FIG. 2. The completely filled contact via 16 occurs because the preferred process conditions enhance the surface migration of the deposited aluminum atoms, so that aluminum forms in the bottom of the via 16 preferentially to formation on the oxide layer 14 near the edges of the via 16. The process conditions described below provide for a relatively flat upper surface for aluminum layer 20, and this effect tends to improve the planarity of aluminum layer 20 to a greater degree as the width of contact opening 16 decreases. Improvement in planarity of the aluminum layer of interconnect makes it possible to fabricate two or more contacts stacked one above the other. Such a stacked contact is shown in FIG. 3. The process conditions for completely filling contact vias and allowing for stacking of contacts is especially suitable for use with contact openings having submicron dimensions.

After formation of the aluminum layer 20, the aluminum layer and the barrier layer are patterned and etched using techniques known in the art. A second insulating layer 22, such as plasma oxide, another oxide layer or sandwiched dielectrics as known in the art, is then formed over the surface of the integrated circuit and planarized. A second contact opening 24 is formed in insulating layer 22 followed by the deposition of a second barrier layer 26 over the integrated circuit. At this stage in the process, the barrier layer acts as a diffusion barrier and reduces contact/via resistance. A second aluminum layer 28 is deposited as before. The aluminum layer forms a second level of metal interconnect, which is then patterned and etched to give the structure shown in FIG. 3.

If desired, a third metal interconnect layer can be fabricated on top of the structure shown in FIG. 3 using the techniques described above. Due to the planarization caused by the process conditions described below, multiple interconnect levels are easily fabricated. As device densities increase, stacking contacts allows for complex signal routing to be performed using aluminum interconnect layers.

Figure 4:
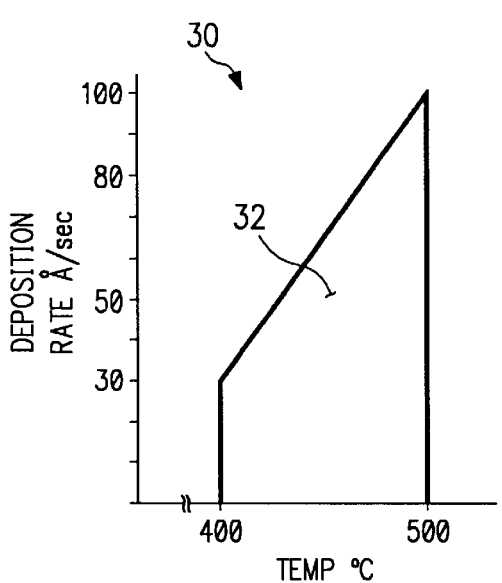
FIG. 4 is a graph illustrating preferred process conditions for formation of an aluminum contact.
Figure 5A:
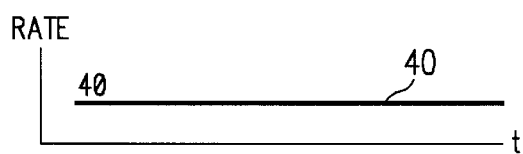
FIGS. 5(a)–5(d) illustrate several alternative deposition rate diagrams for forming aluminum contacts according to the present invention.
Figure 5B:
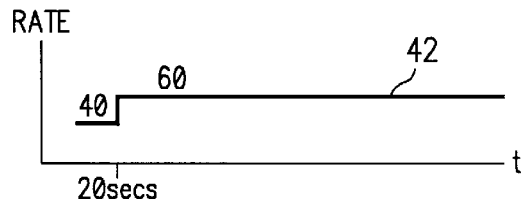
Figure 5C:
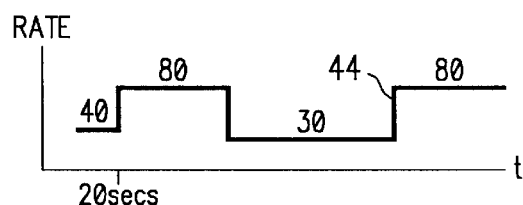
Figure 5D:
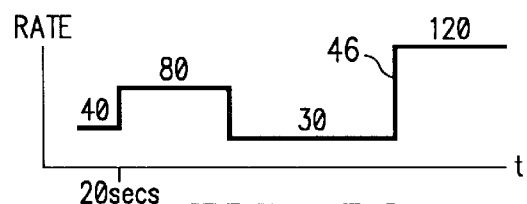

FIGS. 4 and 5 illustrate preferred conditions for deposition of the aluminum layer 20 in order to provide an improved contact. Graph 30 illustrates the deposition rate, in angstroms per second, as a function of the deposition temperature in degrees Celsius. The preferred region 32 lies between 400–500 degrees C., with the maximum deposition rate lying below a line extending from a rate of about 30 angstroms per second at 400 degrees C. to 100 angstroms per second at 500 degrees C.

When aluminum is deposited within this preferred region 32, its surface migration characteristics are enhanced over metal deposited under other conditions. For example, depositing aluminum at temperatures higher than 500 degrees C. tends to form large grains, so that blocking of the contact opening occurs as described earlier. If the deposition rate is too high, the deposited aluminum is not able to migrate quickly enough into the via to completely fill the via. Therefore, the region 32 depicted in FIG. 4 outlines, approximately, a preferred pairing of processing conditions under which deposited aluminum migrates into the contact via and fills the via while minimizing the formation of voids and uneven regions.

Process conditions can be varied slightly from that shown in FIG. 4 without departing from the teachings of the present invention. For example, temperatures slightly below 400 degrees C. can be used, as long as the deposition rates are not too high. As the temperature decreases, the mobility of the deposited aluminum atoms goes down. Incomplete filling of the via occurs if the deposition rates are too high.

FIG. 5 includes four graphs illustrating preferred processes by which an aluminum interconnect layer can be formed. All of these processes utilize, to a greater or lesser degree, processing which occurs within the preferred region 32. Each of the curves 40, 42, 44, 46 illustrates a variation in the aluminum deposition rate with time. Each curve 40–46 illustrates an alternative process utilizing the concepts of the present invention.

Each of the four processes shown in FIG. 5 preferably uses approximately the same set of initial conditions. In the prior art, it is common to deposit a very thin layer of small grain aluminum at a relatively cold temperature, typically below 350 degrees C., and then stop the deposition process. The wafer on which the integrated circuit device is located is then preheated to the required deposition temperature, over 500 degrees C. by bathing the wafer with a stream of preheated argon gas. Once the wafer has reached the deposition temperature, deposition of the aluminum is resumed at such elevated temperature.

With the present technique, aluminum is preferably deposited on the device continuously while the device is being heated. Thus, a small amount of aluminum is deposited on the device while the wafer is at or below 350 degrees C. As the wafer gradually heats to the desired deposition temperature, aluminum deposition continues. This process gives a layer of aluminum which is deposited with very small grain sizes, tending to minimize grain size growth at later stages. The deposition temperature is between 400–500 degrees C., and is typically reached in about 40 seconds.

FIG. 5 shows deposition rate curves for four alternative deposition processes. For all of the curves in FIG. 5, the initial temperature of the wafer is assumed to be approximately 350 degrees C., with the final deposition temperature being 450 degrees C. Heating the wafer to 450 degrees C. takes approximately 40 seconds. It will be appreciated by those skilled in the art that different deposition temperatures may be used. Once the wafer has heated to the deposition temperature, the temperature remains constant.

Curve 40 in FIG. 5(*a*) depicts a deposition process in which the deposition rate stays constant during the entire course of depositing the aluminum layer 20. Deposition begins when heat is first applied to the wafer in the chamber, and continues while the wafer heats to 450 degrees C. and remains there. At a rate of 40 angstroms per second, an 8000 angstrom thick aluminum layer will take approximately 200 seconds to deposit.

FIG. 5(*b*) shows an alternative deposition process in which the deposition rate is performed at 40 angstroms per second for the first 20 seconds, and 60 angstroms per second thereafter. The temperature is increasing toward the 450 degree C. point during the entire deposition step at 40 angstroms per second, and for the first 20 seconds at 60 angstroms per second. For an 8000 angstrom layer, the process curve 42 will result in an aluminum layer formation process which takes approximately 140 seconds.

Curve 44 shows a process in which the initial deposition rate is 40 angstroms per second, followed by an increase to 80 angstroms per second after 20 seconds. After approximately one-third of the entire thickness of the aluminum layer has been deposited, the deposition rate is changed to 30 angstroms per second. This rate is maintained for the deposition of approximately another one-third of the entire layer thickness, followed by an increase of the deposition rate back to 80 angstroms per second.

The process depicted by curve 44 will take approximately 160 seconds to deposit an 8000 angstrom layer of aluminum. This assumes that 2400 angstroms are deposited during each of the 80 angstrom per second segments, and during the 30 angstrom per second segment. The process shown in FIG. 5(*c*) provides for an initial fast deposition of aluminum, followed by a slow deposition period in which deposited aluminum is given the opportunity to migrate into the contact opening. The 30 angstrom deposition period will last for approximately 80 seconds, in order to deposit 2400 angstroms.

Curve 46 in FIG. 5(*d*) starts in the same manner as curve 44, but ends with a higher deposition rate. Processing time is saved by the faster deposit ion near the end of the process. By this point in the deposition process, the contact opening has been mostly filled, and the possibility of voiding in the via has been greatly decreased. Thus, there is no harm to depositing aluminum at a rate which falls outside of the preferred region 32.

It will be appreciated by those skilled in the art that the processes shown in FIG. 5 are illustrative and not definitive. Other variations are possible. The precise combination of deposition temperatures and rates can be varied to suit the requirements and restrictions of the particular processes at hand. For example, if large contact openings only are used, faster deposition rates can be made as the voiding problem is not so critical. For processes such as those illustrated by curves 44, 46, it is not necessary to adhere to a one-third thickness deposition at each rate. These rates and times may be varied to suit the requirements of a production process while still taking advantage of the concepts of the invention.

It is also possible to use the technique of depositing aluminum within the preferred area 32 without continuously depositing aluminum while the wafer temperature is ramping up to the deposition temperature. As is done in the prior art, a thin layer of aluminum can be deposited at relatively cold temperatures, preferably below 350 degrees C. Deposition is then stopped while the wafer is brought to a temperature between 400 and 500 degrees C. Deposition is then resumed at a rate within the preferred region 32, and completed using the teachings set forth above. For example, any of the curves in FIG. 5 can be used, with a difference that the initial 40 angstroms per second deposition rate is omitted.

Use of the continuous layer formation while the wafer is being heated, combined with deposition at rates and temperatures within the preferred region 32, results in small deposited aluminum grain size and very good filling of the contact via. Filling of the contact via is caused both by the good surface migration characteristics of the deposited aluminum layer at the temperatures and deposition rates described, and because very small initial grain sizes result in smaller final grain sizes, having less tendency to block off the via before it is completely filled.

Due to the planarization caused by the above described process, the top of each of the aluminum contacts is substantially flat which allows multiple interconnect levels to be more easily fabricated than has been the case in the past. A contact to contact connection is thus made similar to a connection between a contact and any other type of interconnect. Filling of the contact vias without voiding provides for good conductivity from the top contact in a stack all the way through to the bottom contact in the stack. Thus, this method of filling the contact vias reduces the overall contact resistance.

While the invention has been particularly shown and described with reference to a preferred embodiment, it will be understood by those skilled in the art that various changes in form and detail may be made therein without departing from the spirit and scope of the invention.

What is claimed is:

1. A method of forming interlevel aluminum contacts in integrated circuits, comprising the steps of:

forming a first insulating layer over a conducting layer;

forming a first contact opening through the insulating layer to expose a portion of the conducting layer;

forming a first barrier layer over the insulating layer, in the opening and over the exposed portion of the conducting layer;

beginning to deposit aluminum at a temperature below approximately 350° C. on the barrier layer at a relatively low rate of deposition;

during said beginning to deposit aluminum step, beginning to raise the temperature of the integrated circuit;

continuing to deposit aluminum while increasing the temperature from below approximately 350° C. to a desired temperature between approximately 400° C. and approximately 500° C.;

after the integrated circuit temperature has reached the desired temperature, depositing an aluminum layer on the integrated circuit to a desired thickness;

during the desired thickness depositing step, controlling the rate at which the aluminum layer is deposited to allow deposited aluminum to migrate into the opening so as to provide a substantially complete contact fills;

patterning the aluminum layer to define a first aluminum interconnect layer;

forming a second insulating layer disposed over the first aluminum interconnect layer and the first insulating layer;

forming a second contact opening in the second insulating layer, wherein the second contact opening exposes a portion of the first aluminum interconnect layer directly over the first contact opening;

forming a second barrier layer over the second insulating layer and in the second contact opening;

beginning to deposit a second aluminum layer at a temperature below approximately 350° C. on the second barrier layer at a relatively low rate of deposition;

during said beginning to deposit a second aluminum layer step, beginning to raise the temperature of the integrated circuit;

continuing to deposit the second aluminum layer while increasing the temperature from below approximately 350° C. to a desired temperature between approximately 400° C. and approximately 500° C.;

after the integrated circuit temperature has reached the desired temperature, depositing the second aluminum layer on the integrated circuit to a desired thickness; and during the step of depositing the second aluminum layer to a desired thickness, controlling the rate at which the second aluminum layer is deposited to allow deposited aluminum to migrate into the second contact opening so as to provide a substantially complete contact fill.

2. The method of claim 1, wherein the controlling step comprises the step of:

maintaining the deposition rate to be less than approximately $$(0.7* T)-250 \text{ angstroms/sec}$$

where T lies between approximately 400 degrees C. and approximately 500 degrees C.

3. The method of claim 1, wherein the deposition rate is varied, with one portion being faster than approximately 50 angstroms/sec, and another portion being slower than approximately 50 angstroms/sec.

4. The method of claim 3, wherein a last portion of the deposition step is performed at a deposition rate faster than approximately 100 angstroms/sec.

5. The method of claim 4, wherein a first deposition portion is performed at a rate above approximately 40 angstroms/sec.

6. A method of forming interlevel metal contacts in integrated circuits, comprising the steps of:

forming a first insulating layer over a conducting layer;

forming a first contact opening through the first insulating layer to expose a portion of the conducting layer;

forming a first barrier layer over the first insulating layer, in the opening and over the exposed portion of the conducting layer;

beginning to deposit aluminum at a temperature below approximately 350° C. on the barrier layer at a relatively low rate of deposition;

during said beginning to deposit the aluminum step, beginning to raise the temperature of the integrated circuit;

continuing to deposit the aluminum while increasing the temperature from below approximately 350° C. to a desired temperature between approximately 400° C. and approximately 500° C.;

after the integrated circuit temperature has reached the desired temperature, depositing a first layer of the aluminum on the integrated circuit to a desired thickness;

during the step of depositing the first layer of aluminum to a desired thickness, controlling the rate at which the aluminum layer is deposited to allow deposited aluminum to migrate into the opening so as to provide a substantially complete contact fill;

forming a second insulating layer disposed over the first aluminum layer and the first insulating layer;

forming a second contact opening in the second insulating layer, wherein the second contact opening exposes a portion of the aluminum layer over the first contact opening;

forming a second barrier layer over the second insulating layer and in the second contact opening;

beginning to deposit a second layer of aluminum at a temperature below approximately 350° C. on the second barrier layer at a relatively low rate of deposition;

during said beginning to deposit a second layer of aluminum step, beginning to raise the temperature of the integrated circuit;

continuing to deposit the second aluminum layer while increasing the temperature from below approximately 350° C. to a desired temperature between approximately 400° C. and approximately 500° C.;

after the integrated circuit temperature has reached the desired temperature, depositing the second aluminum layer on the integrated circuit to a desired thickness; and during the step of depositing the second aluminum layer to a desired thickness, controlling the rate at which the second aluminum layer is deposited to allow deposited aluminum to migrate into the second contact opening so as to provide a substantially complete contact fill.

7. The method of claim 6, wherein the controlling step comprises the step of:

maintaining the deposition rate to be less than approximately $$(0.7* T)-250 \text{ angstroms/sec}$$

where T lies between approximately 400 degrees C. and approximately 500 degrees C.

8. The method of claim 6, wherein the deposition rate is varied, with one portion being faster than approximately 50 angstroms/sec, and another portion being slower than approximately 50 angstroms/sec.

9. The method of claim 8, wherein a last portion of the deposition step is performed at a deposition rate faster than approximately 100 angstroms/sec.

10. The method of claim 9, wherein a first deposition portion is performed at a rate above approximately 40 angstroms/sec.

\* \* \* \* \*